United States Patent
Chopard et al.

(10) Patent No.: US 12,025,648 B2
(45) Date of Patent: Jul. 2, 2024

(54) THERMOELECTRIC DEVICE WITH SEEBECK EFFECT

(71) Applicant: HUTCHINSON, Paris (FR)

(72) Inventors: Fabrice Chopard, Saint Martin d'Heres (FR); Jérémy Guazzagaloppa, Poussan (FR); Cédric Huillet, Montargis (FR)

(73) Assignee: HUTCHINSON, Paris (FR)

( * ) Notice: Subject to any disclaimer, the term of this patent is extended or adjusted under 35 U.S.C. 154(b) by 404 days.

(21) Appl. No.: 17/431,421

(22) PCT Filed: Feb. 14, 2020

(86) PCT No.: PCT/FR2020/000034
§ 371 (c)(1),
(2) Date: Aug. 16, 2021

(87) PCT Pub. No.: WO2020/165510
PCT Pub. Date: Aug. 20, 2020

(65) Prior Publication Data
US 2022/0155362 A1    May 19, 2022

(30) Foreign Application Priority Data
Feb. 15, 2019 (FR) .................................... 1901581

(51) Int. Cl.
*G01R 31/26* (2020.01)
*G01R 31/28* (2006.01)
(Continued)

(52) U.S. Cl.
CPC ..... *G01R 31/2601* (2013.01); *G01R 31/2862* (2013.01); *H10N 10/17* (2023.02); *H10N 10/82* (2023.02); *H10N 10/857* (2023.02)

(58) Field of Classification Search
CPC ............ G01R 31/2601; G01R 31/2862; H10N 10/17; H10N 10/82; H10N 10/857;
(Continued)

(56) References Cited

U.S. PATENT DOCUMENTS

| 5,168,339 A | 12/1992 | Yokotani et al. |
| 5,411,599 A | 5/1995 | Horn et al. |
| 2013/0008181 A1* | 1/2013 | Makansi ............ A41D 13/0025 62/3.61 |

FOREIGN PATENT DOCUMENTS

| CN | 104 851 965 A | 8/2015 | |
| KR | 20130136609 A * | 12/2013 | ............ F21V 23/004 |

OTHER PUBLICATIONS

C. G. Mattsson, G. Thungstrom, K. Bertilsson, H.-E. Nilsson and H. Martin, "Design of a Micromachined Thermopile Infrared Sensor With a Self-Supported \${\rm SiO}_{2}/{\rm SU}{-}8\$ Membrane," in IEEE Sensors Journal, vol. 8, No. 12, pp. 2044-2052, Dec. 2008, doi: 10.1109/JSEN.2008.2007679 (Year: 2008).*

(Continued)

*Primary Examiner* — Tung X Nguyen
*Assistant Examiner* — Robert P Alejnikov, Jr.
(74) *Attorney, Agent, or Firm* — Cozen O'Connor

(57) ABSTRACT

The invention relates to a porous thermoelectric material (5; 5a, 5b): having, at 20° C. and at atmospheric pressure, a thermal conductivity of less than 100 mW/(m·K) and an electrical conductivity of between 20 S/m and 105 S/m, and comprising a matrix of a thermal insulating material which has a porosity of more than 70%, and which may be filled at least locally with an electrically conductive material (5b), the content of the electrically conductive material being comprised between 0% and 90% by weight of the total weight of the thermal insulating material.

12 Claims, 5 Drawing Sheets

(51) Int. Cl.
  *H10N 10/17* (2023.01)
  *H10N 10/82* (2023.01)
  *H10N 10/857* (2023.01)

(58) Field of Classification Search
  CPC ........ H10N 10/13; H10N 10/85; Y02E 60/10;
   Y02T 10/70; B01J 13/0091; H01M
   2010/4278; H01M 10/425; H01M
   2200/00; H01M 10/6572; H01M 10/659;
   B60L 58/26
  USPC .................................................... 324/762.01
  See application file for complete search history.

(56) References Cited

OTHER PUBLICATIONS

K. Xie, S. Wu, C. Yang, Y. Ruan and Y. Hong, "A New Seafloor Hydrothermal Power Generation Device Based on Waterproof Thermoelectric Modules," in IEEE Access, vol. 8, pp. 70762-70772, 2020, doi: 10.1109/ACCESS.2020.2986857 (Year: 2020).*

International Patent Application No. PCT/FR2020/000034, International Search Report and Written Opinion dated Feb. 8, 2021, 35 pgs.

Wenting Dong et al: "Characterization of bismuth telluride aerogels for thermoelectric applications", MRS Proceedings, vol. 1306, Jan. 1, 2011 (Jan. 1, 2011), XP055481391.

* cited by examiner

THERMOELECTRIC DEVICE WITH SEEBECK EFFECT

CROSS-REFERENCE TO RELATED APPLICATIONS

This application is a 35 U.S.C. § 371 filing of International Application No. PCT/FR2020/000034 filed Feb. 14, 2020, which claims the benefit of priority to French Patent Application No. 1901581 filed Feb. 15, 2019, which is incorporated herein by reference in its entirety.

TECHNICAL FIELD OF THE INVENTION

In a world of increasing energy demand, the problem of energy recovery and/or production is essential.

Heat loss is involved in many industrial processes. Thermoelectricity has a role to play through the Seebeck effect.

Moreover, the wish to avoid losing useful energy (such as thermal energy) or to avoid that a first temperature disturbs a second one, leads one to consider with interest the active insulation which consists in converting thermal energy into electrical energy. An efficient thermoelectric material will then require both a high electrical conductivity and Seebeck coefficient and a low thermal conductivity.

In particular, two areas of application of the Seebeck principle have been identified:
- devices operating as sensors or detectors, for automotive or aeronautical applications for example,
- photovoltaic electrical energy production.

These two fields may have in common the functionalisation of some thermal insulating materials possessing low thermal conductivity ($\lambda \leq 100$ mW/(m·K)) in order to add, or use, thermoelectric capacity (provided through a filler or intrinsic to the material).

Both may be failure-detection devices related to loss of vacuum.

A "photovoltaic device" is to be understood here as a device with thermoelectric capacity (containing a thermoelectric material) adapted to provide electrical energy at its output (as in terminals 9a, 9b, FIG. 10), if it receives thermal energy, which may be that from photons, hence the term 'photovoltaic'.

The term "thermoelectric device" is therefore also appropriate for it; the two are synonymous.

SUMMARY OF THE INVENTION

In one aspect, the present invention relates to a porous thermoelectric material:
- having, at 20° C. and at atmospheric pressure (absolute), a thermal conductivity of less than 100 mW/(m·K) and, at the location of at least one zone having a thermoelectric capacity, having an electrical conductivity a of between 20 S/m and 100,000 S/m, and
- comprising a matrix made of a thermal insulating material:
    - which has a porosity of more than 70%, and
    - which may be filled/provided, at least locally, with an electrically conductive material, the content of the electrically conductive material being comprised between 0% and 90% by weight of the total weight of the thermal insulating material.

If this specific thermoelectric material is not used, in a thermal insulation application, such as that of failure detection (device 20 below), the thermoelectric material will advantageously be at least porous.

"Which may be filled/provided at least locally with an electrically conductive material" indicates that the material of the matrix is adapted to be filled (and thus will or will not be provided) with an electrically conductive material, and this over all or part of its volume and/or its thickness and/or its surface. The same relative meaning is to be applied to the following expression: "which may occupy . . . only a minor part . . . ".

"Porous" means a material having interstices allowing the passage of air or a gas. Open-cell porous materials thus include foams but also fibrous materials (such as glass wool or rock wool).

In the search for efficiency, the ratio of the pore volume of the thermal insulating material to the volume occupied by the thermal insulating material shall be at least 70%, give or take 10%. It is specified that the expression pressure shall always be understood as absolute.

A metallic aerogel, such as graphene, could be suitable as a porous thermoelectric material, and thus as a matrix in thermal insulating material. In such a case, there would not necessarily be a need for a fill of said electrically conductive material. In particular, a fill could be dispensed with if the electrical conductivity exceeds the value of $10^3$ S·m$^{-1}$, to within +/−20%.

In any case, for example in a vehicle, the solution of the invention will provide a material which, within an adapted device, will offer a thermoelectric capacity allowing to generate a certain quantity of electricity:
- and then participate in the thermal management of its environment (for example, thermal regulation of a battery which could be done in combination with PCMs—phase-change material),
- or to make available a certain amount of electrical energy, via a photovoltaic device.

The term "battery" is to be understood in this text as "an electrical device (or power supply system) that heats up and operates within a preferred temperature range that is important to manage".

Electric storage battery and combustion (or fuel) cell are synonyms for "battery" here. According to a further feature, it is proposed that in the porous thermoelectric material, the content of the electrically conductive material is between 1% and 90%, and preferably 10% and 80%, by weight of the total weight of the thermal insulating material, to within +/−10%.

Thus, the doping will be homogeneous throughout the material and will allow to reach an optimized electrical conductivity threshold.

It is proposed that in the porous thermoelectric material the thermal insulating material is an organic or inorganic material, in particular a pyrolysed product of the same organic or inorganic material, or organic-inorganic hybrid, in particular of a composition derived from sol-gel, more particularly a composition derived from resorcinol and formaldehyde.

Pyrolysis increases the carbon content of the material, thus improving its thermoelectric properties.

The pyrolyzed product may be a xerogel or a carbon aerogel.

It is further proposed that the porous thermoelectric material comprises a sol-gel derived composition having a porous matrix.

Thus, in addition to having good electrical conductivity properties, the porosity of the material will allow it to have significantly favorable thermal insulation properties.

It is further proposed that the inorganic material be carbon and/or silica.

These materials are good maydidates for exhibiting good electrical conductivity and thermal insulation properties, making them attractive as thermoelectric materials.

It is further proposed that the porous thermoelectric material has a density of less than 300 kg/m3, preferably less than 200 kg/m3.

In this way, a relevant compromise between weight, thermal insulation effect and thermoelectric effect may be achieved.

It is also proposed that the thermoelectric material has a Seebeck coefficient between −100 µV/K and 100 µV/K.

Thus, for a few tens of degrees of difference, between the hot source and the cold source, the material will allow to generate an interesting voltage to feed a sensor for example.

Furthermore, it is proposed that; urea-formaldehyde, melamine-formaldehyde, cresol-formaldehyde, phenol-furfural, melamine resin, epoxy resin, benzoxazine, polyimide, polyacrylamide, polyacrylonitrile, polyacrylate, polycyanurate, furanic resin, or any mixture thereof, and (ii) a natural polymer from cellulose, viscose and flax, or any mixture thereof—and, if the thermal insulating material is inorganic, the thermal insulating material comprises or is selected or derived from the group consisting of an aluminium oxide, silicon dioxide, titanium dioxide, zinc oxide, zirconium dioxide or any mixture thereof.

Thus, the material may be considered as a thermoelectric material with optimized characteristics.

Whatever the application, a porous thermoelectric material, and in particular the aforementioned specific one, may advantageously be arranged in an envelope, preferably under vacuum, in particular in an application as an element of a device for detecting thermal failure of another element, the "under vacuum" aspect (absolute internal pressure lower than $10^5$ Pa) not being critical for an application in a photovoltaic device, for example.

It should be noted that other thermoelectric materials that could be considered, for example in a photovoltaic application, as below, are a silicon-germanium (SiGe) alloy, or bismuth(III) $Bi_2Te_3$ (e.g. an alloy of bismuth and tellurium alloyed with $Sb_2Te_3$ (an alloy of antimony and tellurium).

It is within this framework that the invention thus proposes the realization of a (thermo)electrical element comprising:
    a thermoelectric material, which may be a porous (and therefore thermally insulating) thermoelectric material, and in particular the aforementioned one, with all or part of its characteristics, and
    electrically conductive cables in electrical connection with at least the said thermoelectrically capable area.

It is proposed, in this (thermo)electric element:
    that the thermoelectric material preferably comprises a matrix of a thermal insulating material, filled at least locally with an electrically conductive material to define a filled matrix material which may occupy, in the electrical element, only a minor part of the matrix of thermal insulating material, and/or
    that said thermoelectric material:
        is porous,
        has, at 20° C. and at atmospheric pressure, a thermal conductivity of less than 100 mW/(m·K) and, in the place of at least one zone showing a thermoelectric capacity, has an electrical conductivity of between 20 S/m and $10^5$ S/m, and
        comprises a matrix of a thermal insulating material:
            which has a porosity of more than 70%, and
            which may be filled at least locally with an electrically conductive material (5b), the content of the electrically conductive material being comprised between 0% and 90% by weight of the total weight of the thermal insulating material.

It is specified that the term "cable" is generic and covers wires, sheets and any elongated element of this nature providing an electrical connection.

At least if there is a vacuum enclosure, the passage of said cables between the outside and inside of the enclosure shall be airtight.

In order to promote the electrical flow and realization of said electrical element, it is proposed to complete the latter with first and second electrically conductive elements:
    located on two opposite sides of the thermoelectric material, electrically bonded with this material, and
    to which the electrically conductive cables are connected.

In order to ensure the expected thermoelectric effect in an efficient manner, it is proposed, for example in a photovoltaic application, that the thermoelectric material is split into a plurality of junction units arranged electrically in series (and thermally in parallel, if necessary), some junction units having a Seebeck coefficient of <0, others a Seebeck coefficient >0, with two adjacent junction units connected alternately on a first side of the thermoelectric material and then on a second side of the thermoelectric material.

It is to be noted that the aforementioned expressions "on a first side . . . then on a second side" and "located towards two opposite sides" only indicate that thermoelectric material is interposed between said respective sides, so that the thermoelectric effect may operate.

In the photovoltaic application, the photovoltaic device will comprise the aforementioned electrical element, with all or part of its characteristics.

Also constituting an aspect of the invention is an assembly comprising, with all or part of their features involved:
    said electrical element, or the failure-detection device, or the photovoltaic device, and, —two elements thermally more conductive than said electrical element on either side of which the thermally more conductive elements are:
    disposed in thermal contact with the electrical element, and
    arranged to be capable of being subjected to different temperatures from each other.

In this way, the presence of the desired thermal gradient between the two opposite faces of the electrical element is favoured.

The terms "assembly" indicates that the listed components are joined together, but does not necessarily imply that these components are fixed together (assembled).

In the application "photovoltaic device", it may be usefully preferred, for thermoelectric efficiency, that as one of these two more thermally conductive elements, there is at least a glazed panel and/or a thermal flux concentrator.

On a vehicle disposed in an outdoor environment and comprising a photovoltaic device as aforesaid, the glazed panel or the heat flux concentrator will be favourably disposed to be exposed to a natural light flux coming from the outside of the vehicle and which will pass through it, in order to take advantage in particular of the brightness of the passenger compartment.

In any application, it may be preferable for the electrical element to be housed in at least a watertight enclosure.

It is also proposed that, in the electrical element, each first and second electrically conductive element has an electrical conductivity σ>$10^2$ S/m and, as the smallest dimension, a thickness greater than 25 µm.

Thus, a relevant compromise between size and electrical performance will be favoured.

For the same purpose and also to aim at a relevant trade-off between bulk, weight and electrical performance, it is also proposed that the thickness (e) of the thermoelectric material is such that e≥1 mm.

And in order to favour also a relevant compromise integrating a reinforced thermal insulating aspect, as in a thermal anomaly detection situation, it is also proposed that, still in said electrical element, the thermoelectric material has:

a thermal conductivity λ<50 mW/(m·K) at 20° C. and a pressure between $10^{-2}$ Pa and $10^3$ Pa, in normal mode, under said vacuum, and, in normal mode, under said vacuum, and λ<150 mW/(m·K) at 20° C. and an atmospheric pressure of $10^5$ Pa, in failure mode, broken vacuum.

Using a sealed envelope as mentioned above, closed and under vacuum, will be useful in the application "detector of a vacuum holding", since it is the envelope which will condition the existence of the vacuum whose presence will then be controlled.

In this case, it may be noted that there are already thermally insulating structures comprising thermal insulating materials, such as polystyrene, polyurethane, an aerogel or a natural polymer, such as cellulose. In some of these structures, the thermal insulating material is enclosed in a vacuum (typically between less than $10^5$ Pa and $10^{-2}$ Pa, at about 20° C.) in a sealed air and water tight envelope. Such a product is often referred to as a VIP.

However, even if care is taken with the quality of the watertight envelope, the requirements of reliability over time mean that it must be considered that it may lose its watertightness. This will result in a significant degradation of the thermal insulation, which depends on the vacuum.

In one aspect, the present invention therefore provides a solution for efficiently detecting a vacuum loss in such a structure.

Therefore, a failure-detection device using the Seebeck effect, is proposed, comprising:

the aforementioned electrical element with an airtight envelope, and a processing unit comprising:

a calculator, to compare a reference data with a data item from an input electrical signal transmitted from the electrical element in said cables, and to output a first signal if the comparison of said data is below a threshold, and a second signal if the comparison of said data is above the threshold, and an information-communication device connected to the calculator and addressing an information depending on said first or second output signal.

Thus, a user may be directly informed, via the information-communication device, of a loss of vacuum, and thus of a thermal anomaly that has occurred.

One advantage of the solution is its efficiency. Thus, in this sensing device, the thermoelectric material may be integrated into a larger heat insulating material. The thermoelectric material (i.e. the part that may generate a Seebeck effect) may form an electrically filled matrix and occupy only a minor part (potentially less than 50% area) of the aforementioned thermal insulating material.

This will also limit costs and facilitate the implementation of the solution.

To detect failures, as aforesaid, the assembly will be favourably provided with sensors) for sensing a plurality of actual temperatures, these sensors being connected to the calculator so that said reference data is a function of these temperatures and is established as a function of a difference between two such temperatures.

In this way, the quality of the measurements will be refined.

A vehicle, in particular a motor vehicle, being also an aspect to which the invention relates, if this vehicle is provided with said failure-detection device, it will be hybrid or electrically driven. As the temperature management of an electric vehicle drive battery in a hybrid or electrically driven vehicle disposed in an outdoor environment is critical, it is hereby proposed, in connection with the above, that the vehicle comprises precisely:

the aforementioned assembly, and as one of the two thermally more conductive elements, a cooling system;

disposed in thermal contact with an electric drive battery of the vehicle and in which a fluid for supplying calories to the battery or for recovering calories from the battery may circulate, and, as the other of the two thermally more conductive elements, a protective plate exposed to said external environment.

Thus, there will be a natural thermal gradient between the protective plate (which may be a rocker panel facing the road) and the cooling system, such as a thermally conductive plate under the battery.

To detect failures, as aforesaid, on such vehicle, it may usefully be provided that said sensors of the actual desired temperatures comprise at least two of:

an external temperature sensor, an engine temperature sensor, and a battery or cooling system temperature sensor.

On this vehicle, the cooling system may also include:

conduits through which said fluid may flow and a phase-change material (PCM) which is adjacent to said conduits.

In this way, it will be possible to ensure management with "thermal inertia" (via the PCM) taking advantage of the above-mentioned thermal specificities of the solution.

It should also be noted that, whatever the application, and even if the failure detection application should perhaps benefit the most, it is also proposed:

that said thermoelectric material has:

a density of less than 300 kg/m3 and preferably of less than 200 kg/m3, an electrical conductivity between 10 et $10^6$ S/m, a Seebeck coefficient between −100 μV/K and 100 μV/K, a strain of less than 2% to 0.1 MPa;

and/or that each first and second electrically conductive element(s) has an electrical conductivity σ>$10^2$ S/m, and preferably σ>$10^3$ S/m, and, as the smallest dimension, a thickness of less than 8 mm;

and/or that the thickness (e) of the thermoelectric material is such that 0.5 mm<e<5 mm.

The parameters and values involved result in a product:

light, if necessary, a very good thermal insulation, operating with a marked temperature gradient between its opposite faces with very good thermal insulation characteristics, even in thin layers (i.e, possibly e<3 mm), with thermal insulation characteristics similar to those of aerogels.

The invention will, if necessary, be better understood and other details, characteristics and advantages of the invention will become apparent upon reading the following description as a non-exhaustive example with reference to the appended drawings.

DETAILED DESCRIPTION OF THE TECHNICAL SOLUTION

Figure 1:
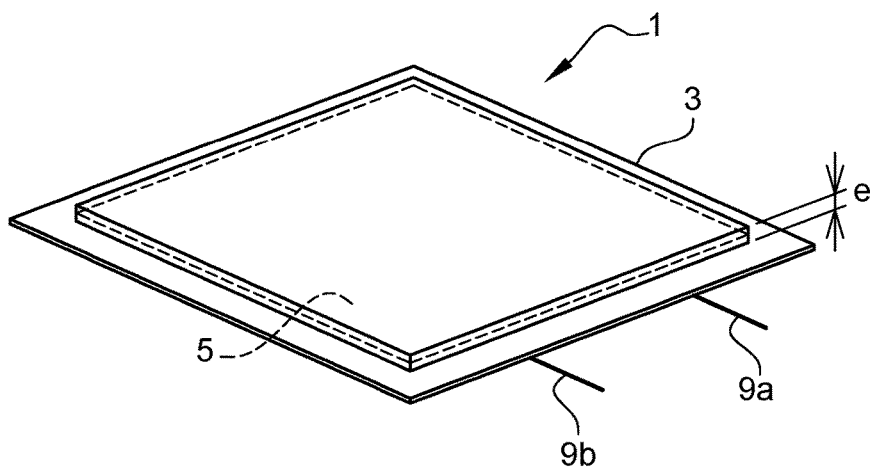
FIG. 1 is a schematic of a thermally insulating element (marked 1) with thermoelectric characteristics.

In order to prepare a porous thermoelectric material (marked 5/5a, 5b in various figures) which may be used, for example, in the fault detection device 20 below, the following procedure may be followed:

a. preparation of an aqueous colloidal suspension of a sol-gel precursor of phenolic origin b. possible addition of an electrically conductive material precursor to the aqueous colloidal suspension obtained in step a., depending on the electrical conductivity threshold to be achieved c. and mixing under ultrasound to a predetermined amount depending on the electrical conductivity to be obtained in the final material, in particular in the range of 20 S/m to $10^5$ S/m.

The electrically conductive material precursor will be intended to be transformed into electrically conductive material, in particular in the form of particles, following a heating step, in particular pyrolysis, at a temperature $T \geq 600°$ C.

Then, the following may be done:

d. if necessary, add a complexing agent to the mixture obtained in step b. (participating in the cross-linking of the network and thus creating a favourable porosity in the material), e. add a catalyst to the mixture obtained in step c., until a pH of 2 is preferably reached in the case of phenolic precursors, the catalyst initiating the polymerization of the mixture, f. transfer the mixture obtained in step d. into a mould and gelling the mixture with a closed mould cover at a temperature of between 80 and 90° C. for at least 24 hours, g. once gelling is complete, dry the gel obtained by evaporation of the solvent with the lid removed at a temperature below 100° C., in particular between 90 and 99° C., and h. pyrolysis of the dried gel obtained in step f. in an inert or reducing environment at a temperature $T \geq 600°$ C., in particular between 600° C. and 1200° C., more particularly between 850° C. and 1050° C.

In particular, the precursor of a thermal insulating material in step a. may be a phenolic compound selected from a group consisting of phenol, pyrocatechol, resorcinol, catechol, hydroquinone, pyrogallol, phloroglucinol, salicylic acid, phloroglucinol, methylphenol, dimethylphenol, trimethylphenol, hydroxymethylphenol, methoxyphenol, methylresorcinol, ethylresorcinol, and mixtures thereof.

The phenolic compound may be suspended or dissolved in water, in an amount between 0.01 to 0.2 moles per mole of water, preferably between 0.06 to 0.14 per mole of water.

Prior to step c., a complexing agent may be added to the mixture obtained in step b., the complexing agent being selected from a group consisting of poly(diallyldimethylammonium chloride), poly(diallyldimethylammonium bromide), quaternary ammonium salts, poly(vinylpyridinium chloride) poly(ethyleneimine), poly(vinylpyridine), poly(allylamine hydrochloride), poly(trimethylammonium chloride ethyl methacrylate), poly(acrylamide) co-dimethylammonium chloride), and mixtures thereof.

The complexing agent may be added in an amount of 0.06 to 0.5 moles per mole of the phenolic compound, preferably 0.08 to 0.1 moles per mole of the phenolic compound.

The catalyst in step c. may be an acid selected from a group consisting of hydrochloric acid, sulfuric acid, nitric acid, acetic acid, phosphoric acid, trifluoroacetic acid, trifluoromethanesulfonic acid, perchloric acid, oxalic acid, toluenesulfonic acid, dichloroacetic acid, formic acid and mixtures thereof.

Formaldehyde may be added, preferably in a weight ratio of 0.5 to resorcinol, in step a. or after step c. and step d.

Figure 2:
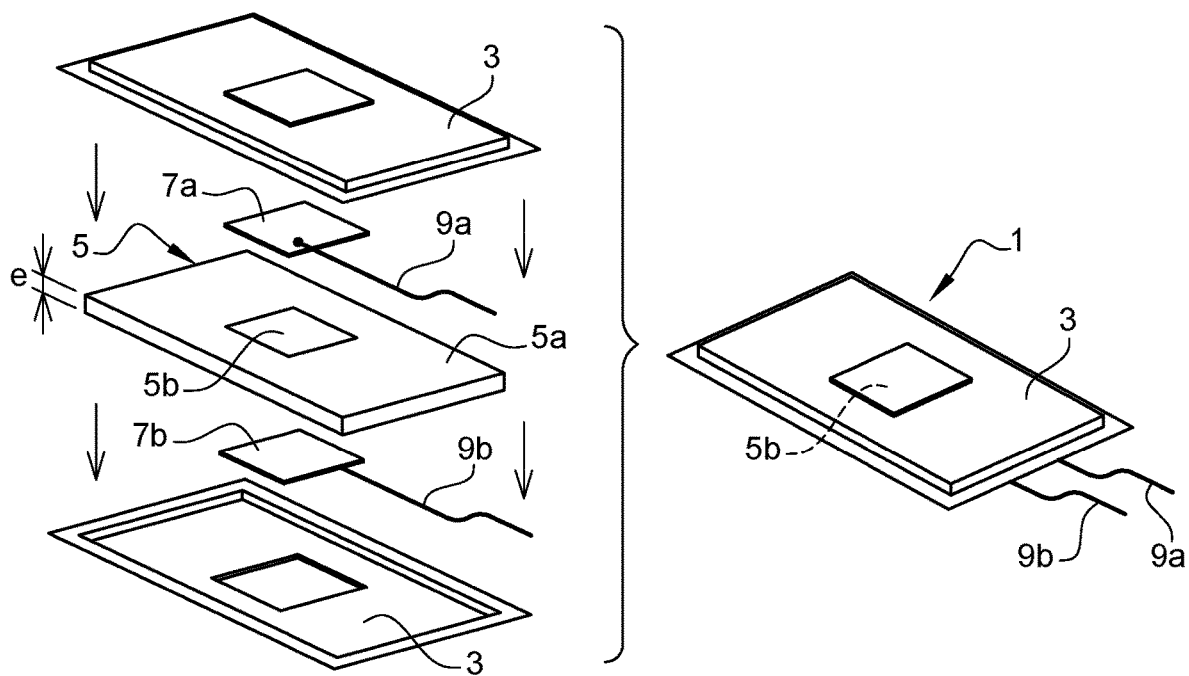
FIG. 2 is an exploded view (left) of element 1, shown in full on the right.

In FIG. 1 and in more detail in FIG. 2, a thermally insulating element 1 with a thermoelectric characteristic is thus shown comprising:

a thermally conductive, preferably watertight envelope 3, which encloses;

the porous thermoelectric material 5, which is thermally insulating, and at least one first and at least one second electrically conductive element 7a, 7b located, depending on the thickness e, on two opposite sides of the thermoelectrically capacitated area (filled matrix 5b in the illustrated example) present in the porous thermoelectric material 5, and a pair of electrically conductive cables 9a, 9b connected to the electrically conductive elements, respectively, and passing through the envelope 3, preferably in a watertight manner.

Each of the first and second electrically conductive elements 7a, 7b will favourably exhibit an electrical conductivity $\sigma > 10^2$ S/m and, as a smaller dimension, a thickness greater than 25 μm, but which may be less than 2 mm or even less than 1 mm.

Thus, a small footprint will be associated with a proven operational efficiency.

The envelope 3 may be a plastic film, a thin metal foil or a shaped metal plate—aluminium for example; thickness from some 1/100 mm to 1 mm. It is rather thermally conductive.

For all purposes, it is specified that at 20° C. and atmospheric pressure:
as thermally conductive, a means with a thermal conductivity $\lambda \geq 100\text{-}150$ mW/(m·K) and
as thermally insulating, a means such that $\lambda \leq 100$ mW/(m·K).

The said first and second electrically conductive elements 7a, 7b, may typically be wafers, small blocks of electrically conductive paste, coatings (electro powder spray coatings) or be formed by screen printing or over-densification.

They could also be absent, replaced by overdoses of an electrically conductive compound on either side of the junction so that there is in any case a gradient in terms of electrical conductivity between two opposite sides of the porous thermoelectric material 5.

In the latter case, the pair of electrically conductive cables 9a, 9b will be connected to the thermoelectrically capable zone of the material 5, via the over-doped lateral zones.

This "thermoelectrically capable zone" is defined:
by the filled matrix 5b, if the material 5 contains at least locally a fill of electrically conductive material, or
by the matrix of thermal insulating material 5a, or even the whole thermal insulating material 5, if the minimum electrical conductivity ($\sigma \geq 10^3$ S·m$^{-1}$ to within +/−20%) is intrinsic to the material.

As already mentioned, in an application as a failure-detection device using the Seebeck effect, the envelope 3 will be favourably airtight and sealed, to allow internal evacuation.

Thus, it will be possible to couple the detection of a vacuum rupture and a thermal insulation failure.

This may in particular be the case on an assembly 10 (FIG. 5) comprising:
the thermally insulating element 1 with thermoelectric characteristic (also called electrical element) or the aforementioned failure-detection device 20), and
two elements 11,13 thermally more conductive than said thermally insulating electrical element 1, on either side of which the thermally more conductive elements 11,13 are:
disposed in thermal contact with the envelope 3 of the thermally insulating element 1, and
arranged to be operationally exposed to different temperatures.

Thus, if the more thermally conductive elements 11, 13 are actually exposed to different temperatures from each other and if, with an airtight envelope 3, an internal vacuum which existed in the internal volume of the envelope is broken (by a leakage of the seal, for example), then an electrical energy arising from the Seebeck effect, which existed before the vacuum was broken, no longer exists: There is no more (or a strong decrease) of thermoelectric activity. In fact, as soon as the vacuum is broken, there will be a modification of the thermal flows involved and a decrease in the thermoelectric efficiency, thus creating an energy gap between a material for which the vacuum is maintained and a material that has lost the vacuum. The temperature of elements 11,13 will tend to a common value.

It is in this context of identifying a Seebeck effect that the imagined failure-detection device 20 is moreover proposed in FIGS. 3-4, which comprises:
the "electrical element" 1, and
a processing unit 15 comprising:
a calculator 17,
a. to compare a reference data with a data item from an electrical input signal transmitted from the electrical element 1 in said cables 9a, 9b, and
b. for outputting a first signal if the comparison of said data is below a threshold, and a second signal if the comparison of said data is above the threshold, and
an information-communication device 16 connected to the calculator 17 and addressing information which will be dependent on said first or second output signal.

Thus it may be possible:
via the calculator 17, to detect:
a change in the transmitted electrical signal due to the Seebeck effect, and thus
whether the thermal coefficient $\lambda$ of the thermally insulating element 1 has changed, and
to provide the information issued from the information-communication device 16 to a user.

The information-communication device 16 may include a transmitter 161 communicating with a receiver 163, which may itself communicate (be connected) with a display or recorder 165, such as a screen, warning light or accessible memory of an on-board calculator, whereby said addressed information will, immediately or with delay, be communicated to an occupant of the vehicle or a maintenance operator operating to check the state of the vacuum in the envelope 3 and thus the quality of the local thermal insulation.

Sensors of several actual temperatures connected to the calculator 17 will further allow said "reference data" to be a function of these temperatures and to be established as a function of a difference (TEG hereinafter) between two of these temperatures.

These sensors (see FIGS. 3-5) may in particular include at least two of:
a sensor 240 for the outside temperature Text,
at least one sensor 261 and/or 263 for the temperature Teng (at) the battery 26 and/or the motor 27 for moving the vehicle 22: electric motor or electric/thermal motors if the vehicle is hybrid, and
a sensor 290 for the temperature Tcool (at) the cooling system 28/110/F1 (this could be the instantaneous temperature of the fluid F1, for example).

From these real time temperature measurements, one could for example predict the following:
if Text<10° C., then the cooling system 28/110/F1 is not functional (no circulation of fluid F1 in the passages 28) and the temperature difference TEG calculated by the calculator 17 to establish the "reference data" to be used in said comparison is TEG=Text−Teng,
if Text>10° C., then the cooling system is functional (circulation of fluid F1 in the passages 28) and the temperature difference calculated by the calculator 17 becomes TEG=Tcool−Teng=10° C.−Teng.

The thermoelectric element 1, or thermally insulating module in this case, is continuously subjected to a temperature difference between its cold side (Text or Tcool, always less than or equal to 10° C. in the example) and its hot side (Teng) and therefore produces at the output 9a/9b a certain amount of electrical energy (U; I; P).

With respect to the processing of this output signal in the processing unit 15 (which could moreover be placed between the elements 163 and 165), this unit 15 has, as input data, the electrical signals issued from:
the various temperature sensors (240, 261, 263, 290), and
said element 1.

The calculator 17 may have been programmed to determine whether, in the operational situation of the vehicle 22 and depending on the temperature difference experienced by the element 1, the electrical output signal it transmits (e.g. voltage value) is above a certain threshold or not.

A comparator integrated in the calculator will then define:
whether the value of the signal is above the threshold: element 1 is in good condition, green light on display 165,
whether the value of the signal is below the threshold: element 1 has a system fault (faulty vacuum): red light on display 165.

The threshold will thus be a reference data available in memory 25 of the calculator 17. This threshold, initially provided in memory 25, will have been calculated on the basis of preliminary tests carried out at different temperatures Text, Teng and Tcool and for one or more materials 5/5a, 5b, and more generally an element 1, or even an assembly 10, identical or at least comparable to the operational solution mounted on the vehicle 22.

Because even with a small change in electrical signals between the thermally well insulated (effective vacuum) and poorly insulated (broken vacuum) states, this change may be detected, the filled matrix material 5b may occupy only a minor portion (i.e., less than 50%) of the thermally insulating matrix 5a in the electrical element 1. A few centimetres-square might be enough.

Figure 3:
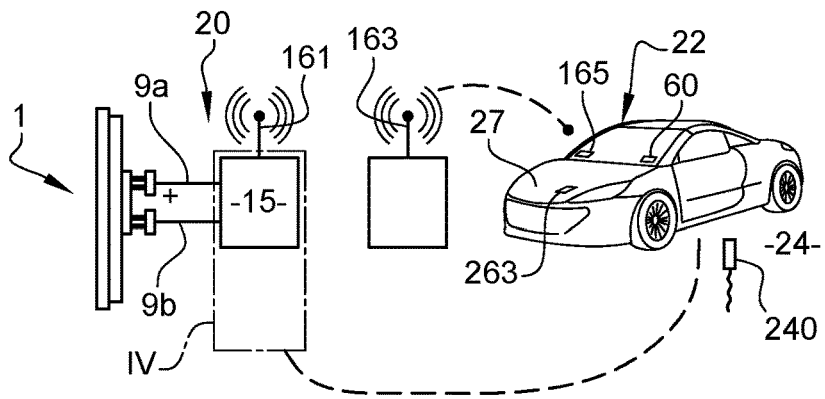
FIG. 3 shows a vehicle equipped with a failure-detection device (marked 20) and a "photovoltaic" device (marked 60) that may use such an element 1.
Figure 4:
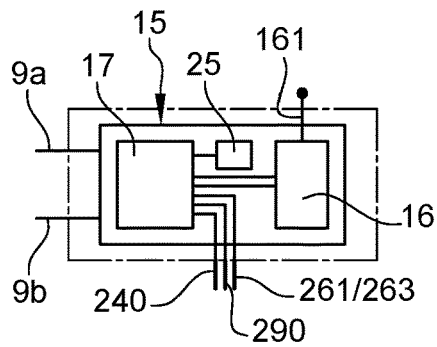
FIG. 4 details the processing unit (marked 15) associated with element 1, in the failure-detection device; detail IV FIG. 3.

FIG. 3 shows a hybrid or electrically driven vehicle 22 disposed in an outdoor environment 24 and comprising:
the assembly 10 or device 20,
as one of the two more thermally conductive elements, such as the one referenced 11, a cooling plate 110; and,
as the other of the two more thermally conductive elements, such as the one referenced 13, a protective plate 130 exposed to said external environment 24.

Figure 5:
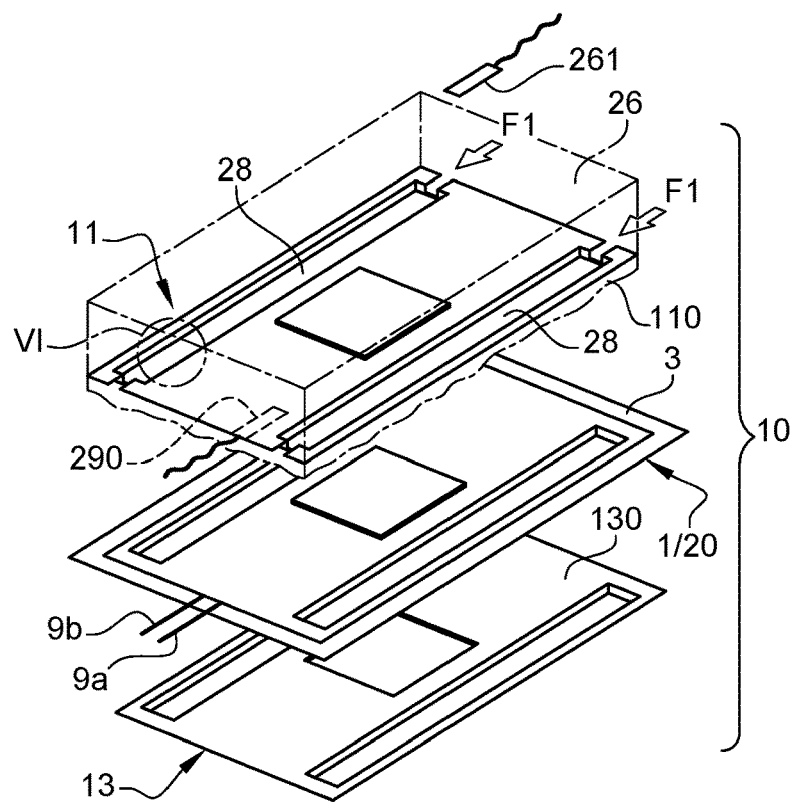
FIG. 5 is an exploded view of the assembly formed by the element 1 between two more thermally conductive elements (marked 11, 13), to form an assembly in conjunction with which the sensing device 20 may operate.

The thermally conductive (metallic, such as steel) cooling plate 110 may be disposed in thermal contact with a vehicle electrical drive battery 26; see FIG. 5.

In the cooling plate 110 may therefore circulate a fluid F1 for supplying calories to the battery 26 or for recovering heat from the battery, such as water, or a heat transfer or cooling fluid.

A system for cooling the battery 26 other than the plate 110 could be provided, such as a forced ventilation system for a fluid coming into thermal contact with the battery, on at least one face of the set of electric accumulators 260 of which it is composed.

The protective plate 130 may be a metal plate—steel for example (thus rather thermally conductive).

Figure 6:
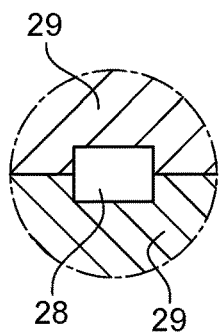
FIG. 6 shows a cross-section (thus following the thickness), a passage in PCM blocks; detail VI of FIG. 5.

The cooling plate 110 will be able:
to be crossed along its surface parallel to the support surface of the modules/cells of the battery 26, by ducts, or passages, 28 in which the said fluid F1 may circulate, and
to comprise, around these ducts/passages 28, one or more blocks of phase-change material (PCM) 29 adjacent to the said ducts/passages, and therefore in heat exchange with this PCM; see FIG. 6.

Thus, thermal energy may be recovered in this PCM 29 and released later.

The passages 28 may be integrated with the plate 110, as shown.

Figure 7:
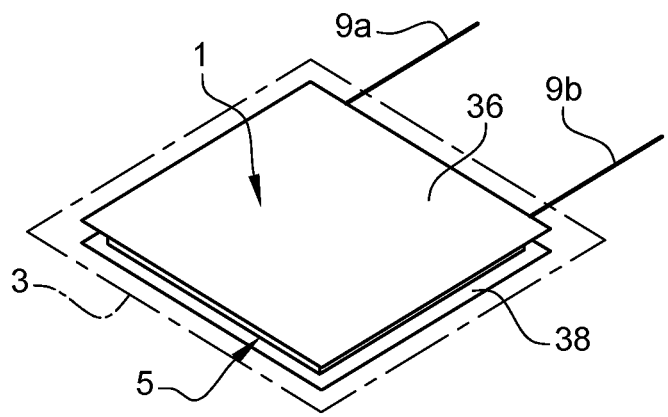
FIG. 7 shows an element 1 whose material (with insulating and thermoelectric capacity) is made up of blocks successively n and p.
Figure 8:
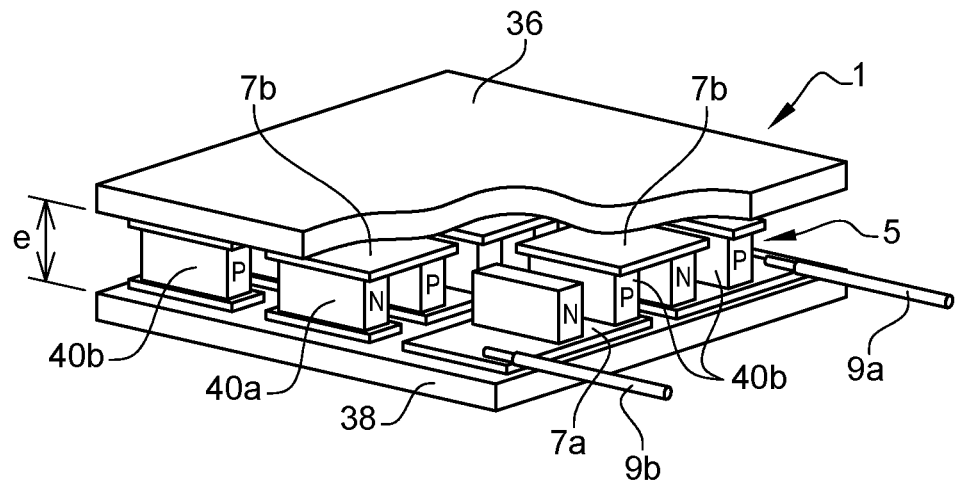
FIG. 8 details such a possible construction.
Figure 9:
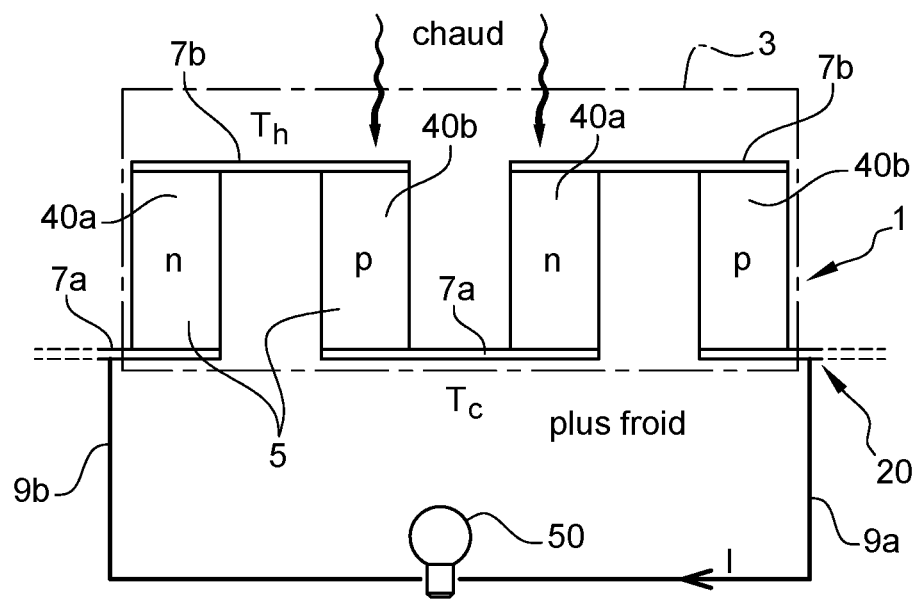
FIG. 9 similarly; only two of the blocks successively n and p are diagrammed there.

In connection with an application for the generation of electrical energy by the Seebeck effect for purposes other than fault identification, such as in particular from solar radiation (photovoltaics), FIGS. 7-9 refer to an "electrical element" 1 as aforesaid except that:

the thermoelectric material 5 is not necessarily a porous thermal insulator, or at least not necessarily the aforementioned one, and
the envelope 3, if it is preferably watertight, as will then be its sealing, does not need to be airtight. In fact, it is conceivable to dispense with envelope 3; see FIG. 8.

In addition to electrically conductive cables 9a, 9b in electrical connection with said thermoelectric material 5, there may also be provided first and second electrically conductive elements 7a, 7b located, towards two opposite sides of the hereinafter presented junction units each comprising a block of thermoelectric material 5.

For construction/handling/safety purposes, the thermoelectric element 1 may also comprise, on either side of the electrically conductive elements 7a, 7b, electrically insulating and thermally conductive plates or substrates 36, 38, e.g. made of ceramic, which may be supplemented or replaced by a closed envelope 3.

As shown in FIGS. 7-10, the material 5 is now split into a plurality of junction units (or blocks) arranged electrically in series—and thermally in parallel—, such as those 40a, 40b for two of them located side by side.

More specifically, to obtain a large Seebeck effect, semiconductor assemblies forming said n-type and p-type junction units 40a, 40b are then used to form the material 5.

Figure 10:
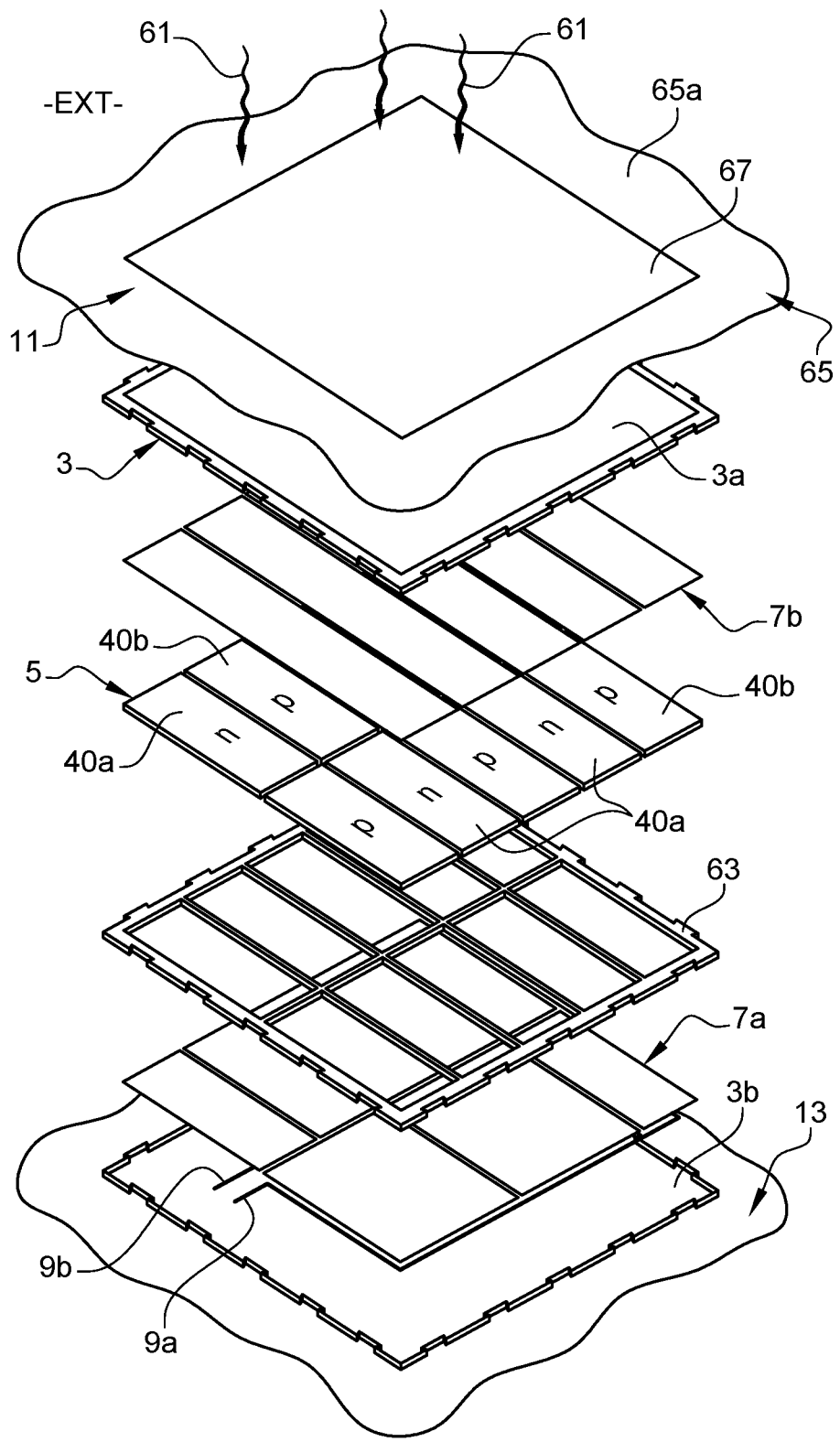
FIG. 10 shows in more detail the above-mentioned photovoltaic device, according to a solution of the invention.

These semiconductor assemblies, 40a, 40b, are connected by metal bridges, formed by the electrically conductive elements 7a, 7b, and the charge carriers therein are electrons and holes, respectively, as shown in FIGS. 8-10.

Depending on the thickness of the junction units 40a, 40b, i.e. the material 5, the electrically conductive elements 7a, 7b, here electrically (and preferably thermally) conductive wafers, connect the semiconductors 40a, 40b . . . *together, electrically in series.*

The junctions provided by these elements 7a, 7b are of two types:
p-n on one side (upper side, series of conductive elements 7b; FIGS. 8-10) and
n-p on the opposite side (bottom side, series of conductive elements 7a; same figures).

Thus, the junction unit 40a (n-type) has a Seebeck coefficient <0; the adjacent junction unit, 40b (p-type) has a Seebeck coefficient >0.

Through the Seebeck effect, an electric current (I) may be dissipated in an output resistor symbolized by the bulb 50 in FIG. 9.

As schematised in this FIG. 9, the thermoelectric element 1 thus receives some thermal energy, arrows 61: amount of heat via a hot source in the example; but it could be frigories, with junction units n and p organized accordingly.

This supplied thermal power is partly transformed into work by element 1, in the form of an output current (I), through the successive alternating n-p and p-n junctions.

It is such a principle that operates on the photovoltaic device 60 of the invention, which may also be called a thermoelectric device, because thermal energy 61 provided other than by photons could be supplied to it.

On this photovoltaic device 60, we find, as schematised in FIG. 10, the aforementioned element 1 schematised in FIGS. 7-9, except that the plates 36, 38 are replaced by a closed envelope 3 comprising two complementary covers 3a-3b able to contain between them, stacked, said first(s) and second(s) electrically conductive element(s) 7a, 7b between which are interposed the alternating successions of junction units 40a (of the n type) and adjacent junction unit 40b (of the p type).

The two covers 3a-3b, when joined together peripherally, will form a closed watertight enclosure 3 through which the conductors 9a, 9b cross. This crossing may be airtight.

For their stability, the 40a (n-type) and 40b (p-type) junction units may be accommodated in an electrically insulating, louvered frame 63.

Through this frame, the junction units 40a, 40b are in electrical contact with the electrically conductive elements 7a, 7b so that (as illustrated in FIG. 10) an electrical current may be generated in the conductors 9a, 9b if, as schematised in FIG. 10, the thermoelectric element 1 therefore receives some thermal energy: arrows 61; in this case a natural light flow coming from the outside of the vehicle 22 on which the photovoltaic device 60 may have been installed; see FIG. 3.

In this case, the vehicle 22 may be thermally driven and the conductors 9a, 9b may be connected to electrical equipment adapted to operate in this way.

As shown in FIG. 10, the arrangement of the electrically conductive elements 7a, 7b is:

along a succession of parallel lamellae, of the conductive element 7b, each covering two units, respectively 40a, 40b, equally elongated, and along that in squares of the conductive element 7a, each covering two units, respectively 40a, 40b, side by side transversely to the preceding direction of elongation.

With a porous thermoelectric material 5 forming the junction units 40a, 40b, a significant thermal gradient between the two opposite sides or faces of the electric element 1 will be favoured.

On the vehicle 22, one 11 of the two aforementioned thermally more conductive elements 11,13 will comprise or be formed by a panel 65, preferably glazed, or a thermal flux concentrator 67, both then adapted to be crossed by the sun's light rays, for the expected photovoltaic effect.

In the illustrated embodiment, the element 11 covers one of the covers 3a over the conductive element 7b.

If a heat flux concentrator 67 is used, it will be usefully disposed in a panel 65 which may not be glazed, such as a sheet metal or non-transparent rigid plastic panel of the vehicle 22 exposed on the outer face 65a to the external environment (EXT) and therefore to the sun.

The second more thermally conductive element 13 will be located further inboard of the vehicle 22 than the element 11. It may be an inner lining panel against which the photovoltaic device 60 is applied by its cover 3b.

To further cost the proposed solution regardless of the application, and with an eye towards efficiency, light weight and small footprint, it is proposed:

that each first and second electrically conductive element 7a, 7b has an electrical conductivity σ>$10^2$ S/m and, as smallest dimension, a thickness of between 25 μm and 5 cm, preferably less than 1 cm or even 5 mm, that the thickness (e) of the thermoelectric material 5 is such that 0.5 mm<e<10 cm and preferably 0.8 mm<e<1 cm.

Figure 11:
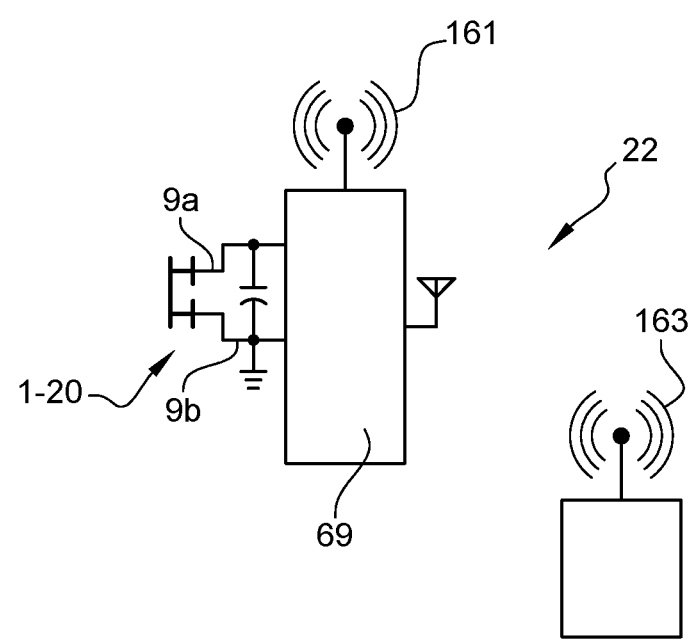
FIG. 11 illustrates an application of the invention to the power supply of a sensor.

Another application is shown in FIG. 11. This is a case where the electrical element 1 is electrically connected to a sensor 69 of parameter(s), such as a physical parameter (temperature, pressure, vibration, humidity, deformation, in particular, or other). The electrical energy generated by the electrical element 1 serves as a source of electrical power to the sensor 69, via the cables 9a, 9b.

The electrical element 1 may be replaced by the failure-detection device 20 (hence the marking 1-20 in FIG. 11).

When used in the context of the vehicle 22, the sensor 69 will be usefully connected to or in communication with the, or provided with the, information-communication device 16 equipped with the transmitter 161 adapted to communicate with the receiver 163.

The pairing of the electrical element 1 (or failure-detection device 20) and sensor 69 will allow to widen the scope of acquisition of a parameter (energy self-sufficiency/low energy/autonomy).

The invention claimed is:

1. A failure-detection device (20) to be operated by Seebeck effect and comprising: —an electrical element (1) comprising: —a thermoelectric material (5;5a,5b), and— electrically conductive cables (9a,9b) in electrical connection with said thermoelectric material, and in which the electrical element: a) the thermoelectric material comprises a matrix (5a) of a thermally insulating material provided at least locally with electrically conductive material (5b) to define a filled matrix material which may occupy, in the electrical element, only a minor part of the matrix (5a) of thermally insulating material, or b) the thermoelectric material (5;5a,5b): —is porous, —has, at 20° C. and at atmospheric pressure, a thermal conductivity of less than 100 mW/(m·K) and, at the location of at least one zone having a thermoelectric capacity, has an electrical conductivity of between 10 S/m and 105 S/m, and, —comprises a matrix of a thermally insulating material: —which has a porosity of more than 70%, and—which is suitable to be provided at least locally with an electrically conductive material (5b), the content of the electrically conductive material being between 0% and 90% by weight of the total weight of the thermal insulating material, —an envelope (3) enclosing the thermoelectric material (5; 5a, 5b) and which: —is air and watertight, vacuum-tight, and—is crossed by the electrical conductor cables (9a, 9b), —a sensor (69) supplied with voltage from said thermoelectric material (5;5a,5b), and—a processing unit connected to the electrical element (1) and comprising: —a calculator (17): —to compare a reference data with a data item issued from an input electric signal transmitted from the electric element (1) in said cables, and—to output a first signal if the comparison of said data is below a threshold, and a second signal if the comparison of said data is above the threshold, and—an information communication device (16) connected to the calculator and addressing information depending on said first or second output signal.

2. The failure-detection device according to claim 1, wherein: —the electrical element (1) further comprises first and second electrically conductive elements (7a, 7b) located towards two opposite sides of the thermoelectric material, and to which the electrical conductor cables (9a, 9b) are connected, —each first electrically conductive element and second electrically conductive element (7a, 7b) has an electrical conductivity a>102S/m and, as a smallest dimension, a thickness of more than 25 pm, and—the thermoelectric material (5,5b) has a thickness between 0.5 mm and 10 cm.

3. An assembly including:
the failure-detection device according to claim 2, and,
two elements (11, 13) thermally more conductive than said electrical element (1), wherein the two elements are
disposed on either side of the electrical element and in thermal contact with the electrical element, and
arranged to be capable of being subjected to temperatures different from each other, so that, with a thermal gradient thus created between two opposite faces of the electrical element, electrical energy is generated by the Seebeck effect in the electrical conductor wires (9a, 9b).

4. The assembly according to claim 3, comprising:
said failure-detection device, and
sensors (240, 261, 263, 290) for sensing a plurality of actual temperatures, connected to the calculator (17) so that said reference data is a function of the actual temperatures and is established as a function of a difference between two of said actual temperatures.

5. A hybrid or electrically driven vehicle (22) disposed in an outdoor environment and comprising:
at least one drive motor (27), and
the assembly according to claim 3, and
as one (11) of the two more thermally conductive elements, a cooling system (110, F1, 28):
disposed in thermal contact with an electric drive battery (26) of the vehicle and
in which a fluid (F1) for supplying calories to the battery or for recovering calories from the battery can circulate, and,
as the other (13) of the two more thermally conductive elements, a protective plate (130) exposed to said external environment.

6. A hybrid or electrically driven vehicle (22) disposed in an outdoor environment and comprising:
at least one drive motor (27),
the failure-detection device according to claim 2.

7. The failure-detection device according to claim 1, wherein the thermoelectric material (5; 5a, 5b) defines a single electrical junction, so that it is devoid of a plurality of junction units (40a, 40b) arranged electrically in series.

8. The failure-detection device according to claim 1, wherein: —the filling of the electrically conductive material (5b) is between 1% and 90% by weight of the total weight of the thermal insulating material, and/or—the thermoelectric material has a Seebeck coefficient between −100 pV/K and 100 pV/K, and/or—the thermoelectric material has a density of less than 300 kg/m3, preferably less than 200 kg/m3.

9. An assembly including:
the failure-detection device according to claim 1, and,
two elements (11, 13) thermally more conductive than said electrical element (1), wherein the two elements are
disposed on either side of the electrical element and in thermal contact with the electrical element, and
arranged to be capable of being subjected to temperatures different from each other, so that, with a thermal gradient thus created between two opposite faces of the electrical element, electrical energy is generated by the Seebeck effect in the electrical conductor wires (9a, 9b).

10. The assembly according to claim 9, comprising:
said failure-detection device, and
sensors (240, 261, 263, 290) for sensing a plurality of actual temperatures, connected to the calculator (17) so that said reference data is a function of the actual temperatures and is established as a function of a difference between two of said actual temperatures.

11. A hybrid or electrically driven vehicle (22) disposed in an outdoor environment and comprising:
at least one drive motor (27), and
the assembly according to claim 9, and
as one (11) of the two more thermally conductive elements, a cooling system (110, F1, 28):
disposed in thermal contact with an electric drive battery (26) of the vehicle and
in which a fluid (F1) for supplying calories to the battery or for recovering calories from the battery can circulate, and,
as the other (13) of the two more thermally conductive elements, a protective plate (130) exposed to said external environment.

12. A hybrid or electrically driven vehicle (22) disposed in an outdoor environment and comprising:
at least one drive motor (27),
the failure-detection device according to claim 1.

\* \* \* \* \*